(12) United States Patent
Abedifard et al.

(10) Patent No.: US 6,496,425 B1
(45) Date of Patent: Dec. 17, 2002

(54) MULTIPLE BIT LINE COLUMN REDUNDANCY

(75) Inventors: Ebrahim Abedifard, Sunnyvale, CA (US); Frankie F. Roohparvar, Milpitas, CA (US)

(73) Assignee: Micron Technology, Inc, Boise, ID (US)

( * ) Notice: Subject to any disclaimer, the term of this patent is extended or adjusted under 35 U.S.C. 154(b) by 8 days.

(21) Appl. No.: 09/642,341

(22) Filed: Aug. 21, 2000

(51) Int. Cl.$^7$ .................................................. G11C 7/00

(52) U.S. Cl. .............. 365/200; 365/230.03; 365/185.11

(58) Field of Search ........................... 365/200, 230.03, 365/63, 185.11, 185.09, 185.21

(56) References Cited

U.S. PATENT DOCUMENTS

| | | |
|---|---|---|
| 5,041,886 A | 8/1991 | Lee |
| 5,257,229 A | 10/1993 | McClure et al. |
| 5,377,146 A | 12/1994 | Reddy et al. |
| 5,537,354 A | 7/1996 | Mochizuki et al. |
| 5,600,605 A | 2/1997 | Schaefer |
| 5,621,690 A | 4/1997 | Jungroth et al. |
| 5,666,321 A | 9/1997 | Schaefer |
| 5,732,030 A | 3/1998 | Dorney |
| 5,734,620 A | 3/1998 | Seyyedy |
| 5,742,549 A | 4/1998 | Ochoa et al. |
| 5,751,039 A | 5/1998 | Kauffmann et al. |
| 5,787,097 A | 7/1998 | Roohparvar et al. |
| 5,808,946 A | 9/1998 | Roohparvar |

(List continued on next page.)

OTHER PUBLICATIONS

Keeth, et al., "DRAM circuit design: a tutorial," IEEE Press, 2001, pp. 16–23, 142–153.

Micron Semiconductor Products, Inc., "2Mb, Smart 5 BIOS–Optimized Boot Block Flash Memory," *Flash Memory* www.micron.com, copyright 2000, Micron Technology, Inc., pp. 1–12.

Micron, "16 Mb: x16 SDRAM" *Synchronous DRAM*, www.micron.com, copyright 1999 Micron Technology, Inc., pp. 1–51.

*Primary Examiner*—A. Zarabian
(74) *Attorney, Agent, or Firm*—Leffert Jay & Polglaze; Thomas W. Leffert

(57) ABSTRACT

Memory devices having multiple bit line column redundancy are suited for high-performance memory devices, with particular reference synchronous non-volatile memory devices. Such memory devices include bloc of memory cells arranged in columns with each column of memory cells coupled to a local line. Such memory devices further include global bit lines having multiple local bit lines selectively coupled to each global bit line, with each global bit line extending to local bit lines in each memory block of a memory sector. Global bit lines are coupled to sensing devices generally in pairs. Repair of one or more defective columns of memory cells within a sector is effected by providing a redundant grouping of memory cells having a redundant sense amplifier, global bit lines and local bit lines. Each grouping of memory cells contains four or more columns of memory cells. Access requests directed to memory cells within a grouping of memory cells containing a defective column are redirected to a redundant grouping of memory cells. Thus, a defect in one column of memory cells results in replacement of four or more columns of memory cells.

40 Claims, 9 Drawing Sheets

U.S. PATENT DOCUMENTS

| | | |
|---|---|---|
| 5,898,627 A | 4/1999 | Yoshikawa |
| 5,910,181 A | 6/1999 | Hatakenaka et al. |
| 5,920,514 A | 7/1999 | Lim et al. |
| 5,936,903 A | 8/1999 | Jeng et al. |
| 5,936,974 A | 8/1999 | Roberts et al. |
| 5,995,438 A | 11/1999 | Jeng et al. |
| 6,018,811 A | 1/2000 | Merritt |
| 6,026,465 A | 2/2000 | Mills et al. |
| 6,077,211 A | 6/2000 | Vo |
| 6,084,807 A | 7/2000 | Choi |
| 6,104,645 A | 8/2000 | Ong et al. |
| 6,134,160 A | 10/2000 | Waller et al. |
| 6,137,133 A | 10/2000 | Kauffman et al. |
| 6,141,247 A | 10/2000 | Roohparvar et al. |
| 6,201,744 B1 * | 3/2001 | Takahashi .............. 365/189.01 |
| 6,327,197 B1 * | 12/2001 | Kim et al. ............. 365/185.09 |

\* cited by examiner

| Left | Pin | | Pin | Right |
|---|---|---|---|---|
| Vcc | 1* | | 54 | Vss |
| DQ0 | 2 | | 53 | DQ15 |
| VccQ | 3 | | 52 | VssQ |
| DQ1 | 4 | | 51 | DQ14 |
| DQ2 | 5 | | 50 | DQ13 |
| VssQ | 6 | | 49 | VccQ |
| DQ3 | 7 | | 48 | DQ12 |
| DQ4 | 8 | | 47 | DQ11 |
| VccQ | 9 | | 46 | VssQ |
| DQ5 | 10 | | 45 | DQ10 |
| DQ6 | 11 | | 44 | DQ9 |
| VssQ | 12 | | 43 | VccQ |
| DQ7 | 13 | | 42 | DQ8 |
| Vcc | 14 | | 41 | Vss |
| DQML | 15 | | 40 | RP# |
| WE# | 16 | | 39 | DQMH |
| CAS# | 17 | | 38 | CLK |
| RAS# | 18 | | 37 | CKE |
| CS# | 19 | | 36 | VccP |
| BA0 | 20 | | 35 | A11 |
| BA1 | 21 | | 34 | A9 |
| A10 | 22 | | 33 | A8 |
| A0 | 23 | | 32 | A7 |
| A1 | 24 | | 31 | A6 |
| A2 | 25 | | 30 | A5 |
| A3 | 26 | | 29 | A4 |
| Vcc | 27 | | 28 | Vss |

*Fig. 2A*

MULTIPLE BIT LINE COLUMN REDUNDANCY

TECHNICAL FIELD OF THE INVENTION

The present invention relates generally to semiconductor memory devices, and in particular, the present invention relates to column redundancy in a multiple bit line architecture for non-volatile semiconductor memory devices.

BACKGROUND OF THE INVENTION

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

There are several different types of memory. One type is RAM (random-access memory). This is typically used as main memory in a computer environment. RAM refers to read and write memory; that is, you can repeatedly write data into RAM and read data from RAM. This is in contrast to ROM (read-only memory), which generally only permits the user in routine operation to read data already stored on the ROM. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM generally cannot be written to in routine operation. An EEPROM (electrically erasable programmable read-only memory) is a special type of non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively. Yet another type of non-volatile memory is a Flash memory. A Flash memory is a type of EEPROM that can be erased and reprogrammed in blocks instead of one byte at a time. Many modern PCs have their BIOS stored on a flash memory chip so that it can easily be updated if necessary. Such a BIOS is sometimes called a flash BIOS. Flash memory is also popular in modems because it enables the modem manufacturer to support new protocols as they become standardized.

A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

A synchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAMs can be accessed quickly, but are volatile. Many computer systems are designed to operate using SDRAM, but would benefit from non-volatile memory.

As memory sizes continue to increase, satisfying the demands for high-speed access of memory arrays becomes increasingly difficult. To meet these demands, designers are turning to more elaborate memory array architectures. These more elaborate memory architectures introduce problems of their own. One such problem is the implementation of redundancy.

Redundancy is a method of incorporating spare or redundant devices on a semiconductor die that can be used to replace defective devices. As an example, a memory device may have redundant columns of memory cells. If a memory cell is determined to be defective, the column containing the defective memory cell is replaced by a redundant column by redirecting the address of the defective column to the redundant column in a manner known in the art. However, more elaborate memory architectures may be incapable of repair through such straightforward replacements.

For the reasons stated above, and for other reasons stated below which will become apparent to those skilled in the art upon reading and understanding the present specification, there is a need in the art for alternate memory array architectures and redundancy organizations in semiconductor memory devices.

SUMMARY OF THE INVENTION

The above-mentioned problems with memory devices and other problems are addressed by the present invention and will be understood by reading and studying the following specification.

Memory devices are described having multiple bit line column redundancy suited for high-performance memory devices, with particular reference to synchronous non-volatile memory devices. Such memory devices include blocks of memory cells arranged in columns with each column of memory cells coupled to a local bit line. Such memory devices further include global bit lines having multiple local bit lines selectively coupled to each global bit line, with each global bit line extending to local bit lines in each memory block of a memory sector. Global bit lines are coupled to sensing devices generally in pairs. Repair of one or more defective columns of memory cells within a sector is effected by providing a redundant grouping of memory cells having a redundant sense amplifier, global bit lines and local bit lines. Access requests directed to memory cells within a grouping of memory cells containing a defective column are redirected to a redundant grouping of memory cells.

For one embodiment, the invention provides a memory array. The memory array includes a first memory block having columns of memory cells coupled to a plurality of first local bit lines, and a second memory block having columns of memory cells coupled to a plurality of second local bit lines. The memory array further includes at least one primary grouping of memory cells having a primary sensing device coupled to a first primary global bit line and a second primary global bit line. Each primary global bit line is coupled to at least two primary local bit lines from the plurality of first local bit lines and at least two primary local bit lines from the plurality of second local bit lines through selective coupling devices. The memory array further includes at least one redundant grouping of memory cells having a redundant sensing device coupled to a first redundant global bit line and a second redundant global bit line. Each redundant global bit line is coupled to at least two redundant local bit lines from the plurality of first local bit lines and at least two redundant local bit lines from the plurality of second local bit lines through selective coupling devices. For another embodiment, the memory array further includes a comparator coupled to the primary groupings of memory cells and the redundant groupings of memory cells for selectively accessing one of the redundant groupings of memory cells when an address applied to the memory array corresponds to a memory cell in a known defective primary grouping of memory cells. For still another embodiment, the memory array further includes addressing circuitry coupled to the primary groupings of memory cells and the redundant groupings of memory cells for decoding an address applied to the memory array, for determining whether the address is directed to a memory cell in a known defective primary grouping of memory cells, and for addressing one of the redundant groupings of memory cells when the address is directed to a memory cell in a known defective primary grouping of memory cells. For yet another embodiment, access requests to a memory cell in a known defective primary grouping of memory cells of the memory array are routable to one of the redundant groupings of memory cells to access a memory cell in that redundant grouping of memory cells.

For a further embodiment, the invention provides a memory array. The memory array includes at least one memory block having columns of memory cells, each column of memory cells being coupled to a local bit line, at least one primary grouping of memory cells having a primary sensing device coupled to a first primary global bit line and a second primary global bit line, and at least one redundant grouping of memory cells having a redundant sensing device coupled to a first redundant global bit line and a second redundant global bit line. Each primary global bit line is coupled to at least two local bit lines of each memory block and each redundant global bit line is coupled to at least two local bit lines of each memory block. For another embodiment, the memory array further includes a comparator coupled to the at least one primary grouping of memory cells and the at least one redundant grouping of memory cells for selectively accessing one of the redundant groupings of memory cells when an address applied to the memory array corresponds to a memory cell in a known defective primary grouping of memory cells. For yet another embodiment, the memory array further includes addressing circuitry coupled to the at least one primary grouping of memory cells and the at least one redundant grouping of memory cells for decoding an address applied to the memory array, for determining whether the address is directed to a memory cell in a known defective primary grouping of memory cells, and for addressing a redundant grouping of memory cells when the address is directed to a memory cell in a known defective primary grouping of memory cells. For still another embodiment, access requests to a memory cell in a known defective primary grouping of memory cells of the memory array are routable to a redundant grouping of memory cells to access a memory cell in that redundant grouping of memory cells.

For another embodiment, the invention provides a method of operating a memory device. The method includes detecting a defect associated with a column of memory cells in a primary grouping of memory cells of the memory device. The primary grouping of memory cells includes a primary sensing device coupled to a first primary global bit line and a second primary global bit line. Each primary global bit line is coupled to at least two primary local bit lines through selective coupling devices, with one of the primary local bit lines being coupled to the defective column of memory cells. The method further includes identifying the primary grouping of memory cells as a known defective primary grouping of memory cells. The method still further includes addressing a memory cell in a redundant grouping of memory cells when an address applied to the memory device is directed to any memory cell in the known defective primary grouping of memory cells. The redundant grouping of memory cells includes a redundant sensing device coupled to a first redundant global bit line and a second redundant global bit line. Each redundant global bit line is coupled to at least two redundant local bit lines through selective coupling devices. Each of the redundant local bit lines is coupled to a column of memory cells not located in the known defective primary grouping of memory cells.

For further embodiments, the invention provides memory devices and assemblies in accordance with the foregoing memory arrays. The invention further provides additional methods and apparatus of varying scope.

BRIEF DESCRIPTION OF THE DRAWINGS

FIG. 2A is a top view of a memory assembly showing a package pin assignment diagram in accordance with the invention.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Figure 1:
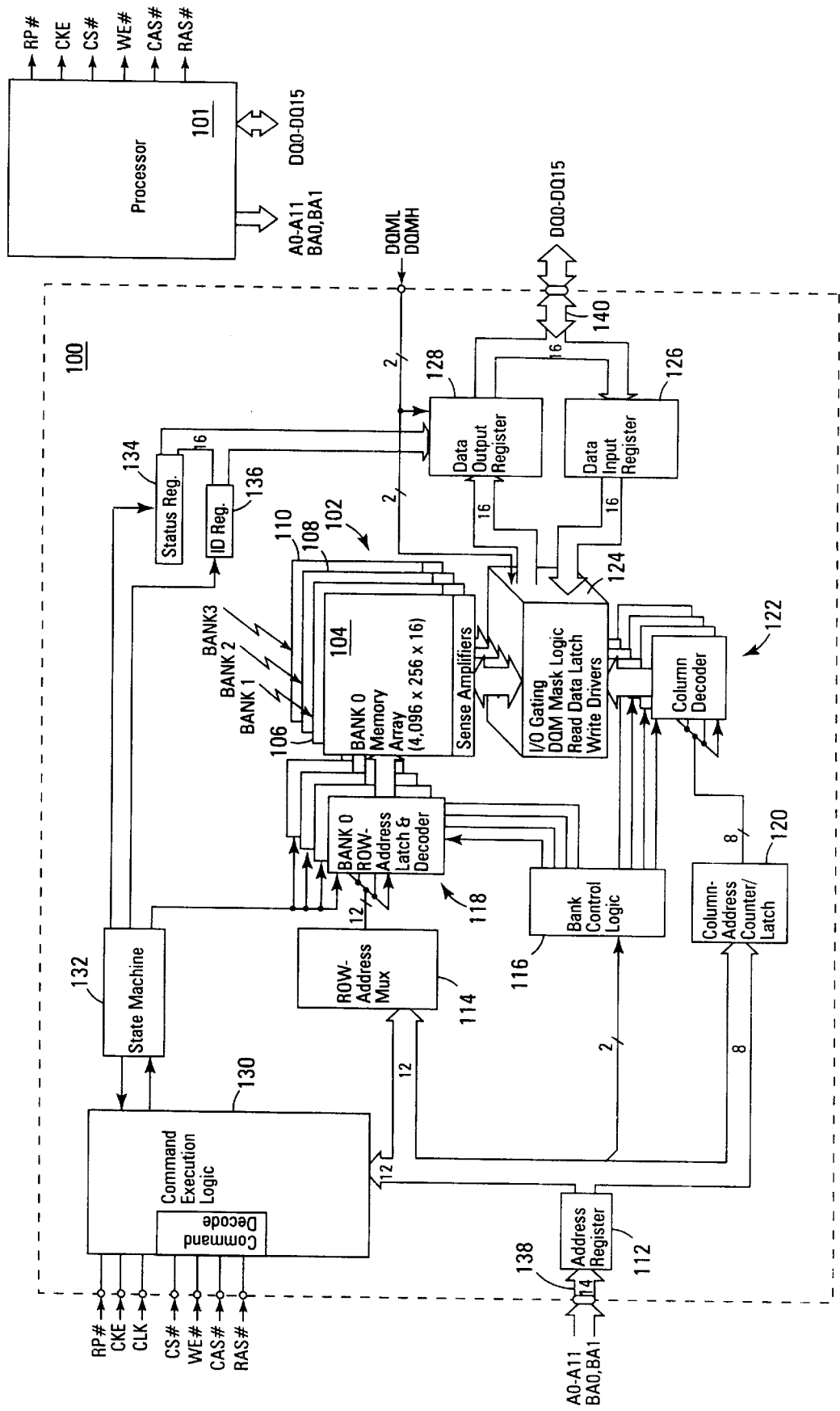
FIG. 1 is a block diagram of a memory device in accordance with the invention.

FIG. 1 is a block diagram of one embodiment of a synchronous memory device in accordance with the invention. The memory device 100 includes an array of non-volatile flash memory cells 102 having an organization with column redundancy as described herein. All access commands to the array 102 of the memory device 100 are synchronized to a system clock input signal (CLK), thus the memory device 100 may be referred to as a synchronous flash memory device or synchronous non-volatile memory device. However, memory array organization with column redundancy in accordance with the various embodiments described herein is not limited to synchronous or non-volatile memory devices.

The array 102 is arranged in a plurality of addressable banks. In one embodiment, the memory contains four memory banks 104, 106, 108 and 110. Each memory bank contains addressable sectors of memory cells. The data stored in the memo can be accessed using externally provided location addresses received by address register 112 through a plurality of address inputs 138. The externally provided location addresses may be provided by a processor 101 of an electronic system as is known in the art. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. The row address multiplexer circuitry 114, the bank control logic 116, the row address latch and decode circuitry 118, the column address counter and latch circuitry 120 and the column decode circuitry 122 can collectively be referred to as addressing circuitry. An address applied to the memory device 100, and thus the memory array 102, is decoded and directed to a target memory cell through such circuits to address, and thus access, the target memory cell. Circuit 124 provides input/output (I/O) gating, data mask logic, read data latch circuitry and write driver circuitry. Data is input through data input registers 126 and output through data output registers 128 using a plurality of data inputs/outputs 140, which are generally coupled to the processor 101 of an electronic system. Command execution logic 130 is provided to generate commands to control the basic operations performed on the memory banks of the memory device. A state machine 132 is also provided to control specific operations performed on the memory banks. A status register 134 and an identification register 136 can also be provided to output data. The command circuit 130 and/or state machine 132 can be generally referred to as control circuitry to control read, write, erase and other memory operations. As is known in the art, integrated circuit memory devices of the type described with reference to FIG. 1 may be fabricated on a substrate, such as a semiconductor wafer, and may be referred to as a memory chip.

FIG. 2A illustrates an interconnect pin assignment of one embodiment of the present invention as a memory assembly having a pin layout substantially similar to an industry standard SDRAM 54-pin TSOP (thin small-outline package) package. Accordingly, the memory assembly has a memory package 150 having 54 interconnect pins and a memory device (not shown) in accordance with the invention. The memory device is contained in the memory package 150. The address inputs, data inputs/outputs, power inputs and clock and control signal inputs of the memory device are coupled to their respective portions of the interconnect pins of the memory package 150 in a conventional manner. Two interconnects shown in the embodiment of FIG. 2A and not present in standard SDRAM packages include control signal RP# and power input VccP. Although knowledge of the function of the various clock and control signals and the various power inputs is not essential to understanding the present invention, a detailed discussion is included in U.S. patent application Ser. No. 09/567,733 filed May 10, 2000 and titled, "Flash with Consistent Latency," which is commonly assigned.

Figure 2B:
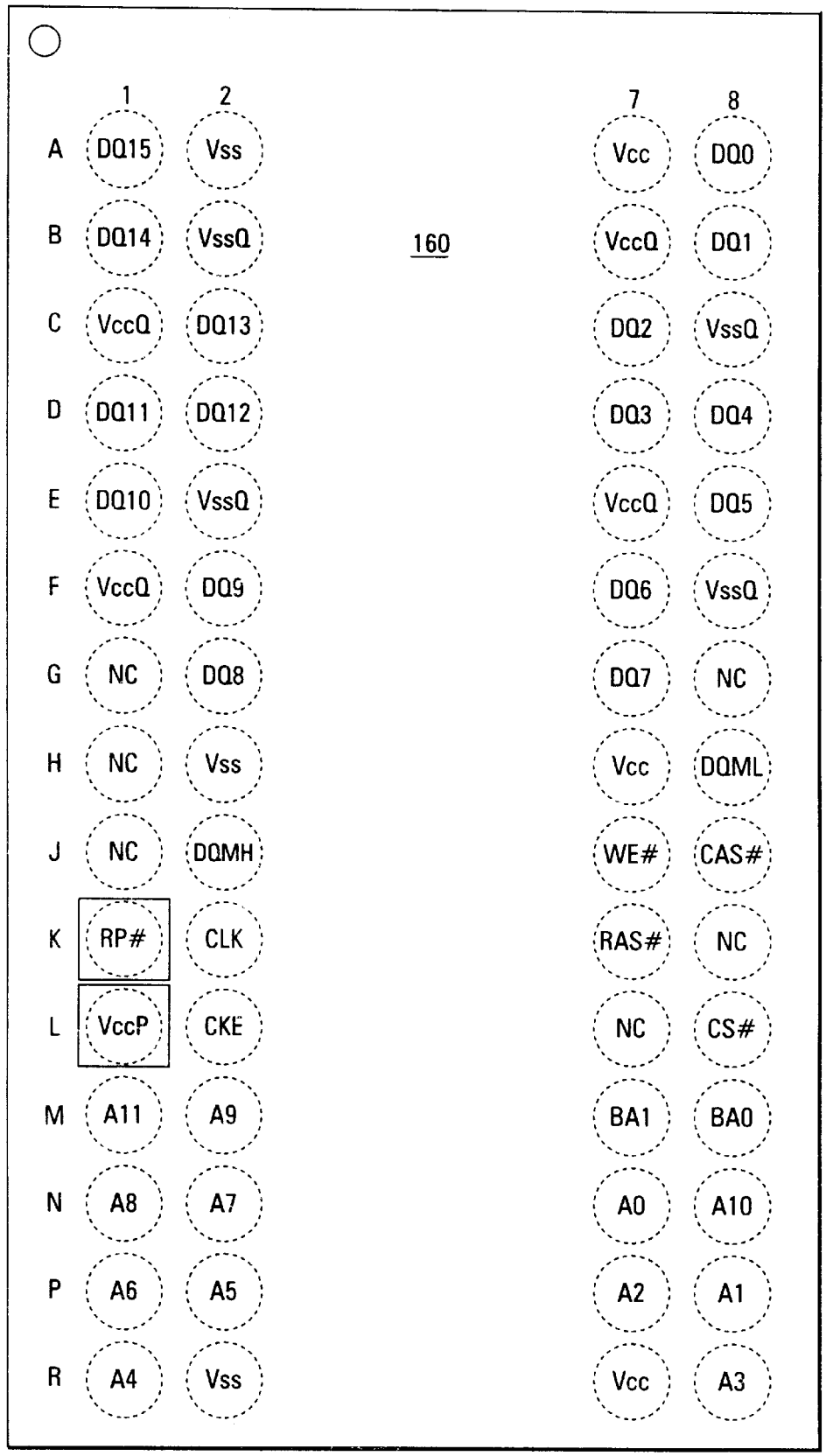
FIG. 2B is a top view of a memory assembly showing a package bump assignment diagram in accordance with the invention.

FIG. 2B illustrates a bump assignment of one embodiment of the present invention as a memory assembly having a bump layout substantially similar to an industry standard SDRAM 60-bump FBGA (fine-pitch ball grid array) package. Memory package 160 is generally similar to memory package 150 except that the interconnects of memory package 160 have bump connections instead of the pin connections of memory package 150. The present invention, therefore, is not limited to a specific package configuration. Furthermore, the invention is not limited to memory packages having pin or bump layouts substantially similar to the interconnect layout of an industry-standard SDRAM package, but is applicable to other memory packages having memory devices containing arrays having an organization with column redundancy in accordance with the various embodiments of the invention.

Figure 3:
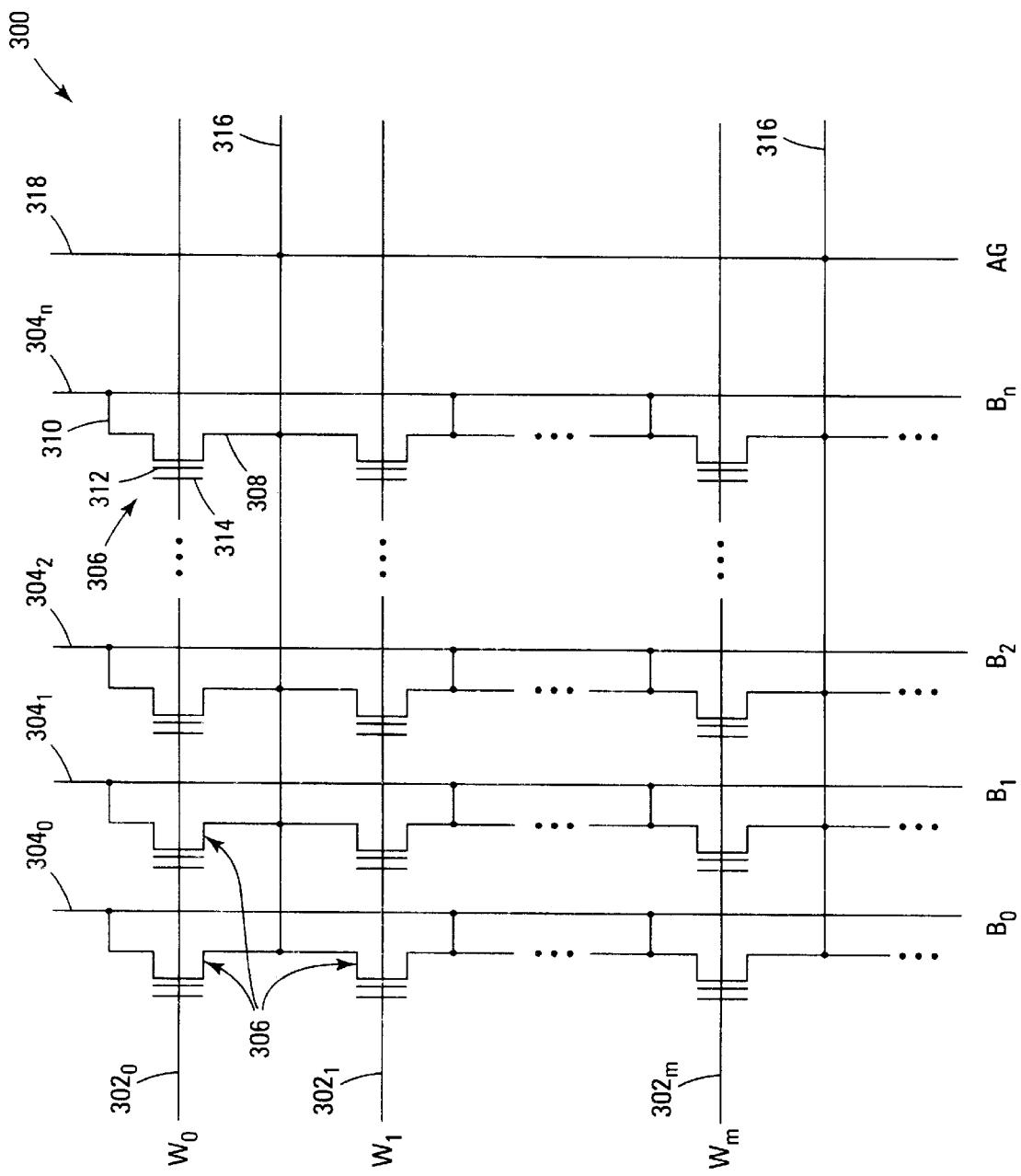
FIG. 3 is a schematic of a portion of a memory block in accordance with one embodiment of the invention.

Arrays of non-volatile memory cells are often configured as floating gate transistors placed at the intersection of word lines and bit lines. The word lines are coupled to the control gates of the floating gate transistors. FIG. 3 is a schematic of a portion of a non-volatile memory block 300 as a portion of a memory array in accordance with one embodiment of the invention.

The detail of memory block 300 is provided to better understand the various embodiments of the invention. However, other memory blocks containing columns of memory cells coupled to bit lines are suited for use in the invention. Accordingly, the invention is not limited to the specific floating-gate memory cell and layout described with reference to FIG. 3.

As shown in FIG. 3, the memory block 300 includes word lines 302 and intersecting local bit lines 304. For ease of addressing in the digital environment, the number of word lines 302 and the number of bit lines 304 are each some power of two, e.g., 256 word lines 302 by 4,096 bit lines 304. The local bit lines 304 are coupled to global bit lines (not shown in FIG. 3) in a many-to-one relationship such that no more than one local bit line 304 may be in electrical communication with any given global bit line in normal operation, with remaining local bit lines 304 being electrically isolated from that global bit line.

Floating gate transistors 306 are located at each intersection of a word line 302 and a local bit line 304. The floating gate transistors 306 represent the non-volatile memory cells for storage of data. Typical construction of such floating gate transistors 306 include a source 308 and a drain 310 constructed from an $N^+$-type material of high impurity concentration formed in a P-type semiconductor substrate of low impurity concentration, a channel region formed between the source and drain, a floating gate 312, and a control gate 314. Floating gate 312 is isolated from the channel region by a tunneling dielectric and from the control gate 314 by an intergate dielectric. The materials of construction are not critical to the invention, but commonly include doped polysilicon for the gate materials, and silicon oxides, nitrides or oxynitrides for the dielectric materials. Floating gate transistors 306 having their control gates 314 coupled to a word line 302 typically share a common source 308 depicted as array source 316. As shown in FIG. 3, floating gate transistors 306 coupled to two adjacent word lines 302 may share the same array source 316. Floating gate transistors 306 have their drains 310 coupled to a local bit line 304. A column of the floating gate transistors 306 are those transistors commonly coupled to a given local bit line 304. A row of the floating gate transistors 306 are those transistors commonly coupled to a given word line 302.

To reduce problems associated with high resistance levels in the array source 316, the array source 316 is regularly coupled to a metal or other highly conductive line to provide a low-resistance path to ground. The array ground 318 serves as this low-resistance path.

Figure 4:
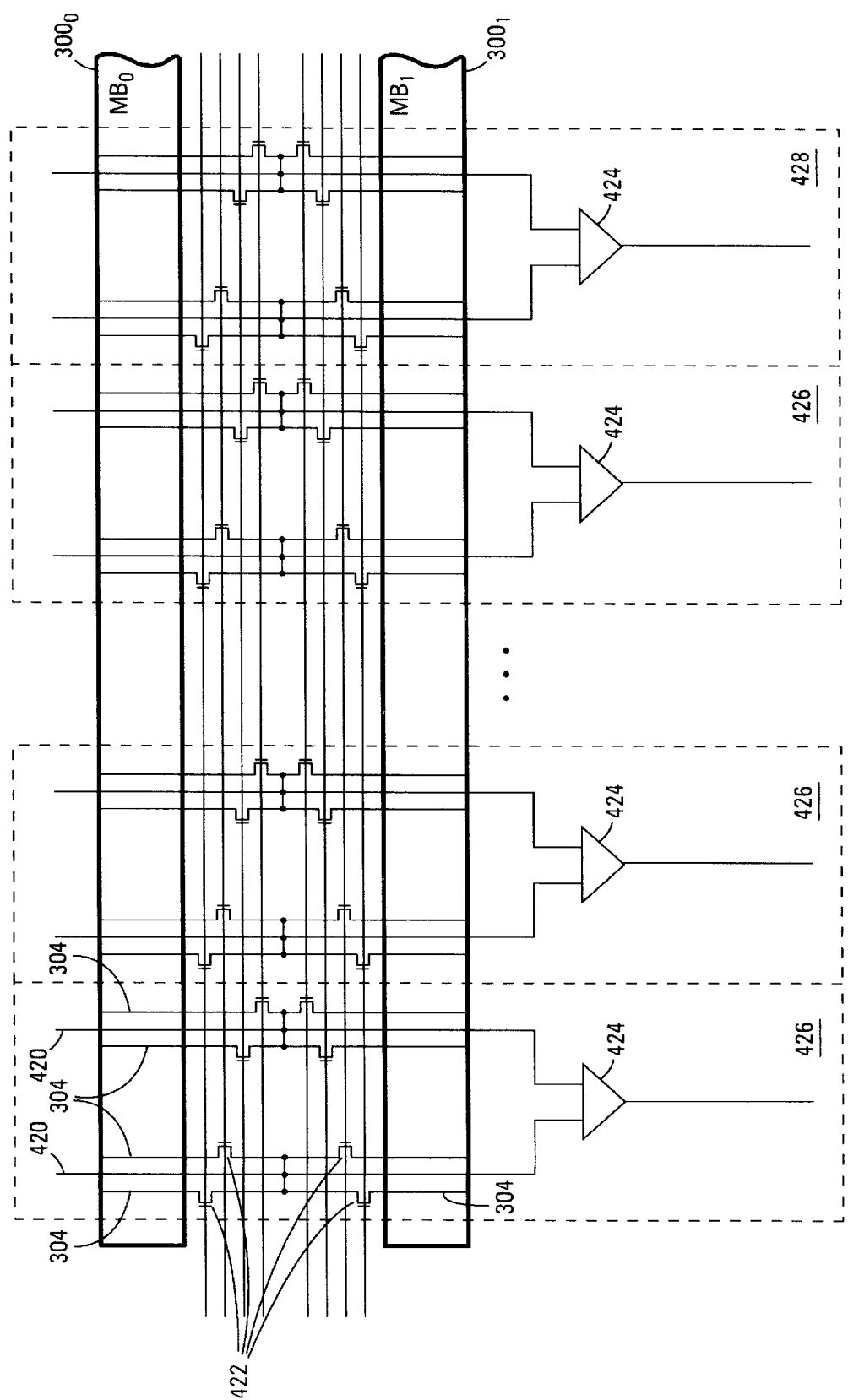
FIG. 4 is a schematic of a portion of a memory sector in accordance with one embodiment of the invention.

FIG. 4 is a schematic of a portion of a memory sector 400 in accordance with one embodiment of the invention. In FIG. 4, certain detail and reference numbers are omitted in the interest of clarity. The omitted detail is apparent from the context of use with reference to FIG. 3.

The portion of a memory sector 400 as depicted in FIG. 4 shows the coupling of local bit lines 304 of a memory block 300 to global bit lines 420 of the memory sector 400. The memory sector 400 includes at least one and preferably two or more memory blocks 300. For ease of addressing, the number of memory blocks 300 included in a memory sector 400 is generally some power of two, and each memory block 300 preferably has the same number of rows and columns. In the embodiment of FIG. 4, memory sector 400 includes two memory blocks $300_0$ and $300_1$ identified as main blocks MB0 and MB1, respectively. Each memory block 300 has a row and column organization as generally described with reference to FIG. 3. In the interest of clarity, individual memory cells are not shown in FIG. 4. To couple an individual memory cell to a sense amplifier 424, its associated word line is activated, thus activating the target memory cell as well as other memory cells associated with the word line. Note that to simplify access circuitry, word lines may be simultaneously activated in more than one memory block 300. The local bit line 304 associated with the target memory cell is then actively coupled to an associated global bit line 420 such as by activating its block pass transistor 422 such that all other local bit lines 304 associated with the global bit line 420 are electrically isolated from the global bit line 420 with deactivated block pass transistors 422. As used herein, actively coupled indicates electrical communication between the coupled elements. Selectively coupled indicates that coupled elements are selectively in a state of electrical communication or electrical isolation.

Block pass transistors 422 are activated in response to control signals from the row and column decoder circuits indicative of the target memory cell. Note that multiple local bit lines 304 may be simultaneously actively coupled to multiple associated global bit lines 420 in a one-to-one relationship to read multiple data bits in the same read operation. Memory cells whose word lines are deactivated or memory cells associated with local bit lines 304 not actively coupled to a global bit line 420 are ignored, i.e., such memory cells are electrically isolated from a sensing device.

As shown in FIG. 4, four local bit lines 304, two from each block 300, are coupled to each global bit line 420 through selective coupling devices, such as block pass transistors 422, with each global bit line 420 extending to two or more blocks 300. The local bit lines 304 are electrically isolated from each global bit line 420 until their associated selective coupling devices are activated. Global bit lines 420 are coupled in pairs to the sense amplifiers 424. Each pair of global bit lines 420 defines a first side, or sensing side, of the sense amplifier 424 and a second side, or reference side, of the sense amplifier 424. The sensing side of the sense amplifier is the side coupled to the target memory cell. Note that there are no intervening sensing devices between a local bit line 304 and its associated global bit line 420. Furthermore, the set of local bit lines 304 associated with one side of a sense amplifier 424 is mutually exclusive from the set of local bit lines 304 associated with the other side of the sense amplifier 424.

For the embodiment depicted in FIG. 4, there is one sense amplifier 424 located in the span of every four local bit lines 304. By coupling each sense amplifier 424 to more than two local bit lines 304, the memory block 300 can make use of tighter packing of memory cells and local bit lines 304. To couple each sense amplifier 424 to only two local bit lines 304, the spacing of the local bit lines 304 may need to increase, the dimensions of the sense amplifiers 424 may need to decrease, or the sense amplifiers 424 may need to be staggered on each end of the memory sector 400; each case, however, would generally lead to a detrimental increase in die size or a detrimental reduction in signal drive by the sense amplifiers 424.

During a read or sensing operation, a first local bit line 304 coupled to the target memory cell is actively coupled to its associated global bit line 420 through its block pass transistor 422 on the sensing side of a sense amplifier 424. To balance capacitance on each side of the sense amplifier 424 during a sensing operation, a second local bit line 304 is concurrently actively coupled to its associated global bit line 420 through its block pass transistor 422 on the reference side of the sense amplifier 424. The second local bit line 304 is electrically floating such that no memory cells are actively coupled to the second local bit line 304. Balancing the capacitance on each side of the sense amplifier 424 is preferred to improve the reliability of the sensing operation. For one embodiment, the first local bit line 304 is in a first memory block, such as main block MB0, while the second local bit line 304 is in a second memory block, such as main block MB1. For another embodiment, the first local bit line 304 and the second local bit line 304 are in the same memory block.

In the architectures thus described, a defect associated with one local bit line 304 will generally affect more than its associated column of memory cells. As an example, a defect associated with a local bit line 304 will risk erroneous data sensing whether the defective local bit line 304 is associated with the target memory cell or whether the defective local bit line 304 is used to balance capacitance on the reference side of a sense amplifier 424. It is known in the art that defective memory cells can be replaced with redundant memory cells. For example, a column of memory cells containing a defect may be replaced by a redundant column of memory cells. However, such replacement is complicated in architectures of the type described with reference to FIG. 4, where multiple local bit lines 304 are associated with each side of a sense amplifier 424.

For one embodiment, column redundancy is effected by providing a redundant sense amplifier 424, and associated global bit lines 420, local bit lines 304 and memory cells. For this embodiment, a defect associated with one primary grouping of memory cells 426 can be repaired by redirecting addressing for the defective primary grouping of memory cells 426 to a redundant grouping of memory cells 428. Thus, any access request, such as a read or write request, to a memory cell in the defective primary grouping of memory cells 426 is redirected to a memory cell in the redundant grouping of memory cells 428, regardless of whether the memory cell in the defective primary grouping of memory cells 426 is itself defective or is itself coupled to a local bit line 304 associated with a defect. Each grouping of memory cells 426, 428 contains a sense amplifier 424 and a pair of global bit lines 420, along with their associated local bit lines 304 and coupled memory cells. For one embodiment, there is one redundant grouping of memory cells 428 for every 256 primary groupings of memory cells 426. a while increasing the ratio of redundant groupings of memory cells 428 to the primary groupings of memory cells 426 increases the likelihood of repairing every defective column of memory cells within the memory device, it also detrimentally increases the die real estate. Accordingly, this ratio should be balanced against the likelihood of defects and the costs of increased die size.

Figure 5:
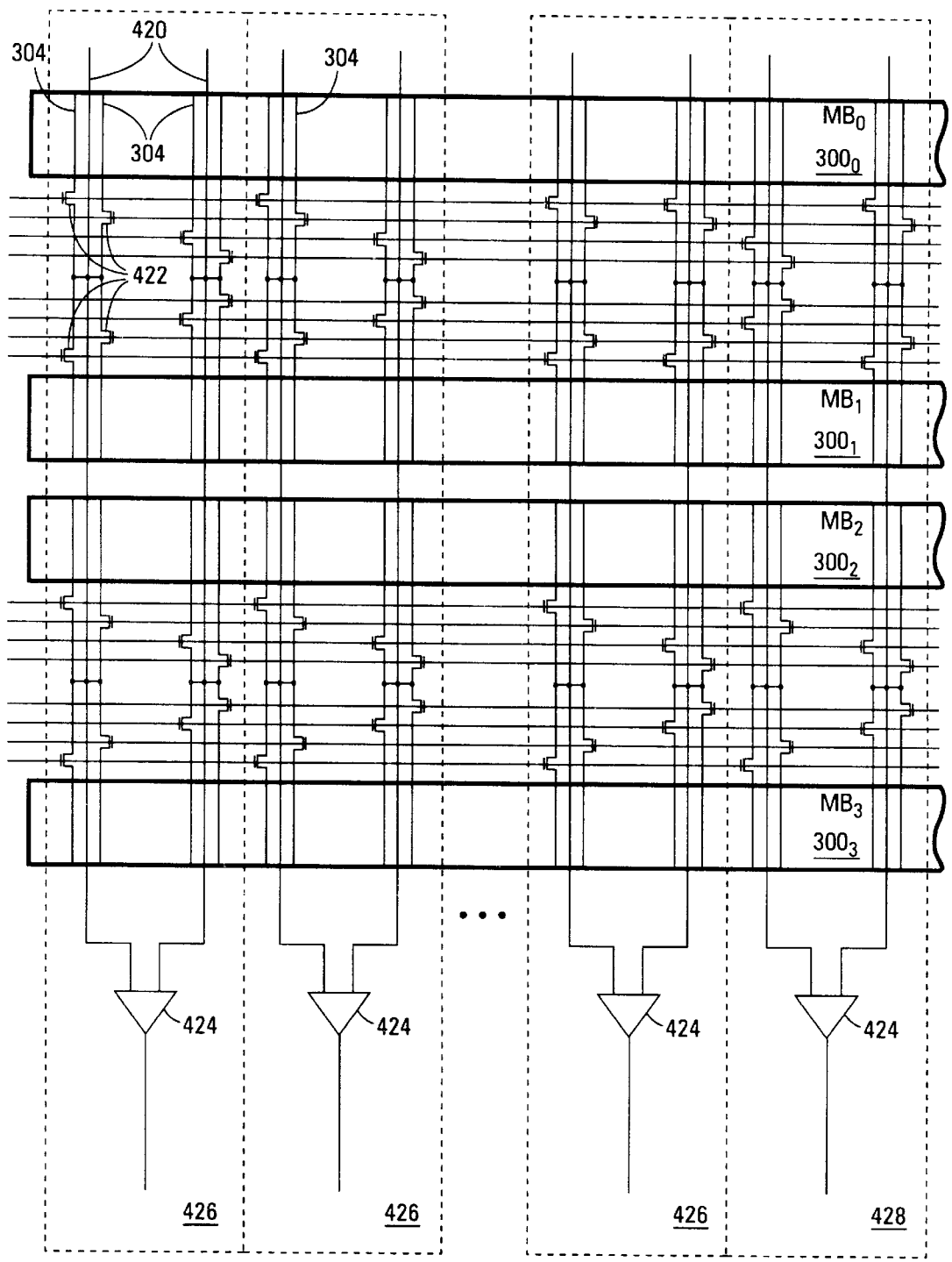
FIG. 5 is a schematic of a portion of a memory sector in accordance with another embodiment of the invention.

FIG. 5 is a schematic of a portion of a memory sector 400 in accordance with another embodiment of the invention having more than two main memory blocks 300. In FIG. 5, certain detail and reference numbers are omitted in the interest of clarity. The omitted detail is apparent from the context of use with reference to preceding figures.

The memory sector 400 of FIG. 5 has four memory blocks $300_0$, $300_1$, $300_2$ and $300_3$, identified as main blocks MB0, MB1, MB2 and MB3, respectively. Local bit lines 304 from each memory block 300 are coupled to global bit lines 420, with two local bit lines 304 from each memory block 300 selectively coupled to each global bit line 420. Global bit lines 420 extend to each memory block 300. As before, global bit lines 420 are coupled in pairs to sense amplifiers 424. While four memory blocks 300 are depicted in FIG. 5, additional memory blocks 300 could be coupled to the global bit lines 420 by extending the global bit lines 420 to the additional memory blocks 300. Note that there is no requirement that the global bit lines 420 extend across the memory block 300 farthest from the sense amplifiers (memory block $300_0$ in the embodiment of FIG. 5); a global bit line 420 need only extend to a point of coupling to the block pass transistors used to couple the global bit line 420 to its associated local bit lines 304. The memory sector 400 includes primary groupings of memory cells 426 as well as one or more redundant groupings of memory cells 428.

Figure 6:
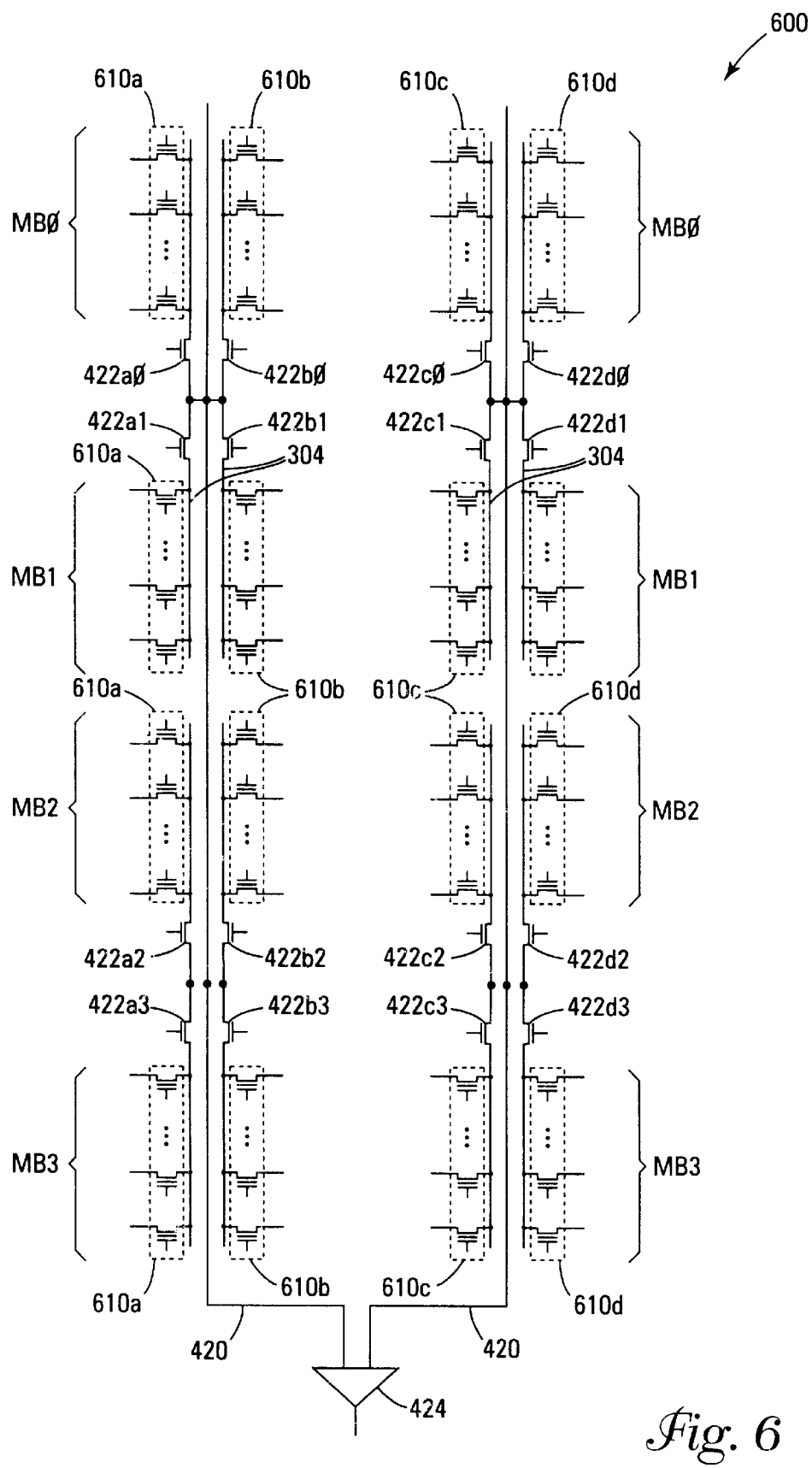
FIG. 6 is a schematic of a grouping of memory cells in accordance with one embodiment of the invention.

FIG. 6 is a schematic of a grouping of memory cells 600. The grouping of memory cells 600 may represent a primary grouping of memory cells 426 or a redundant grouping of memory cells 428. The grouping of memory cells 600 includes the sensing device, such as a sense amplifier 424 and its two global bit lines 420, each having two or more local bit lines 304 coupled through selective coupling devices, such as block pass transistors 422. Each local bit line 304 is coupled to a column of memory cells 610 containing one or more memory cells. The grouping of memory cells 600 extends to each main block of a memory sector. As shown, the grouping of memory cells 600 includes columns of memory cells 610a, 610b, 610c and 610d in each of the main blocks MB0, MB1, MB2 and MB3. For one embodiment, a column address that decodes and activates a block pass transistor 422 associated with a first column of memory cells 610 in a first main block for a read operation also activates a block pass transistor 422 for the first column of memory cells 610 in a second main block, a second column of memory cells 610 in a third main block and the second column of memory cells 610 in a fourth main block. As one example, a read address that activates block pass transistor 422a0 further activates block pass transistors 422a2, 422a1 and 422d3. Table 1 shows how this activation of multiple block pass transistors 422 for sensing and referencing can be carried out for any memory cell within the grouping of memory cells 600. For such an embodiment, local bit lines 304 are used for referencing on both the sensing and reference sides of the sense amplifier 424.

TABLE 1

Sensing and Referencing within a Grouping of Memory Cells

| Target Column | Target Main Block | Block Pass Transistor Activated for Sensing | Block Pass Transistors Activated for Reference |
|---|---|---|---|
| 610a | MB0 | 422a0 | 422a2, 422d1, 422d3 |
| 610a | MB1 | 422a1 | 422a3, 422d0, 422d2 |
| 610a | MB2 | 422a2 | 422a0, 422d1, 422d3 |
| 610a | MB3 | 422a3 | 422a1, 422d0, 422d2 |
| 610b | MB0 | 422b0 | 422b2, 422c1, 422c3 |
| 610b | MB1 | 422b1 | 422b3, 422c0, 422c2 |
| 610b | MB2 | 422b2 | 422b0, 422c1, 422c3 |
| 610b | MB3 | 422b3 | 422b1, 422c0, 422c2 |
| 610c | MB0 | 422c0 | 422c2, 422b1, 422b3 |
| 610c | MB1 | 422c1 | 422c3, 422b0, 422b2 |
| 610c | MB2 | 422c2 | 422c0, 422b1, 422b3 |
| 610c | MB3 | 422c3 | 422c1, 422b0, 422b2 |
| 610d | MB0 | 422d0 | 422d2, 422a1, 422a3 |
| 610d | MB1 | 422d1 | 422d3, 422a0, 422a2 |
| 610d | MB2 | 422d2 | 422d0, 422a1, 422a3 |
| 610d | MB3 | 422d3 | 422d1, 422a0, 422a2 |

Figure 7:
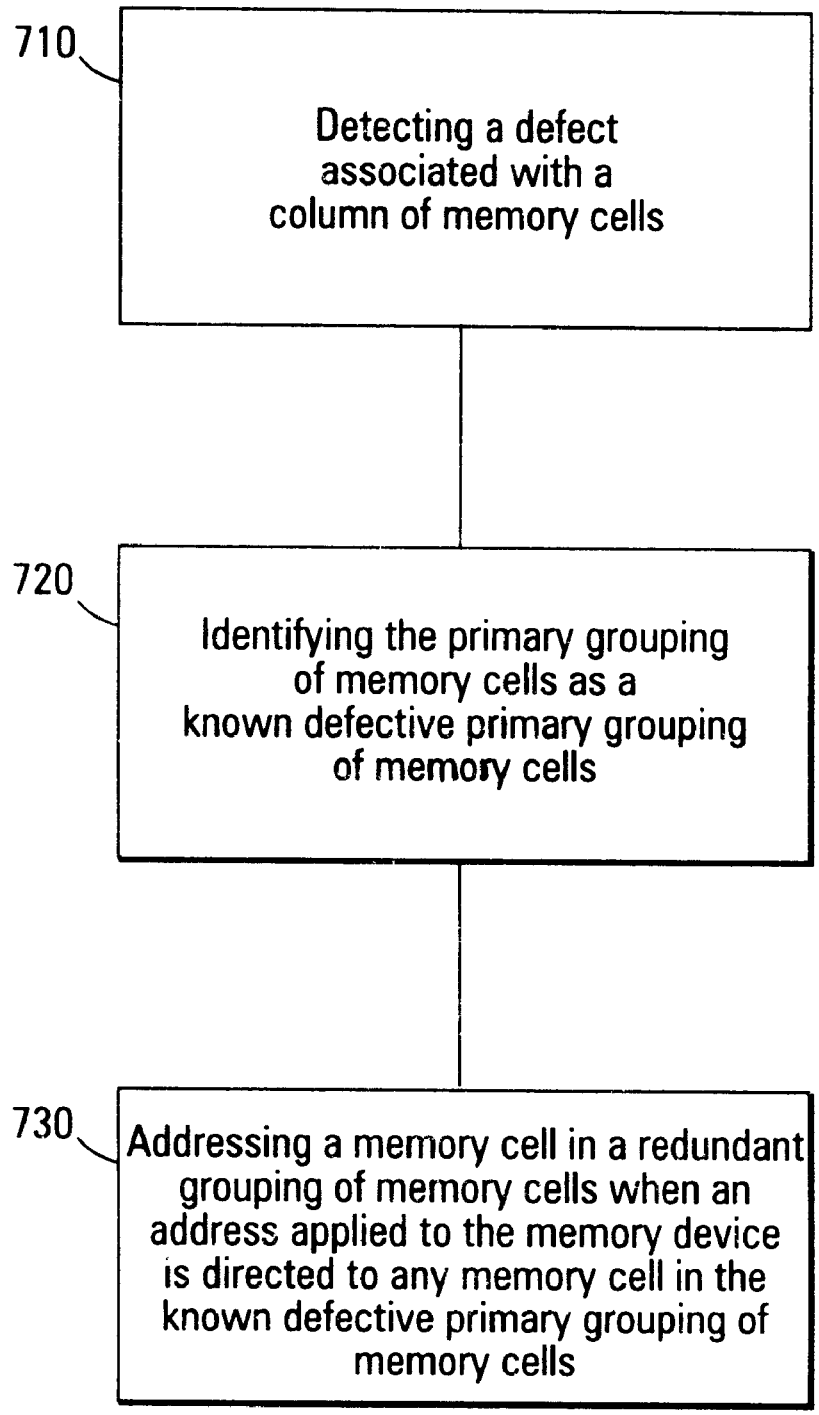
FIG. 7 is a flow chart illustrating one method of operating memory devices in accordance with another embodiment of the invention.

FIG. 7 is a flow chart illustrating one method of operating memory devices in accordance with the invention. In action box 710, a defect associated with a column of memory cells in a primary grouping of memory cells is detected. Various methods of detecting defects are well known in the art of memory device testing. Examples of such defects include a defect in one or more memory cells, a defect in the associated main or global bit lines, or a defect in the associated sensing device. A column of memory cells will be considered defective if one or more of its memory cells cannot reliably be accessed due to one or more such defects. The primary grouping of memory cells containing the defective column of memory cells is identified as a known defective primary grouping of memory cells in action box 720. Such identification can include actions such as programming a match select circuit to recognize the address of any memory cell in the primary grouping of memory cells. In action box 730, an address applied to the memory device corresponding to an address of a memory cell contained in the known defective primary grouping of memory cells is redirected to a memory cell in a redundant grouping of memory cells. With reference to FIG. 6, note that a defect associated with just one column of memory cells 610 in one main block will result in identification of the grouping of memory cells 600 as a known defective grouping of memory cells. As an example, if the memory sector contains main blocks MB0, MB1, MB2 and MB3, and a defect is detected associated with column of memory cells 610b in MB0, the grouping of memory cells 600 will be identified as a known defective grouping of memory cells for each of columns 610a, 610b, 610c and 610d across each main block MB0, MB1, MB2 and MB3. As such, an address applied to the memory device directed to any memory cell in the primary grouping of memory cells 600 containing the known defective memory cell is routable to a memory cell in. a redundant grouping of memory cells. Thus, in this example, an access request directed to a memory cell contained in columns of memory cells not associated with a defect, i.e., non-defective columns of memory cells, will still result in redirection to a redundant memory cell.

Figure 8:
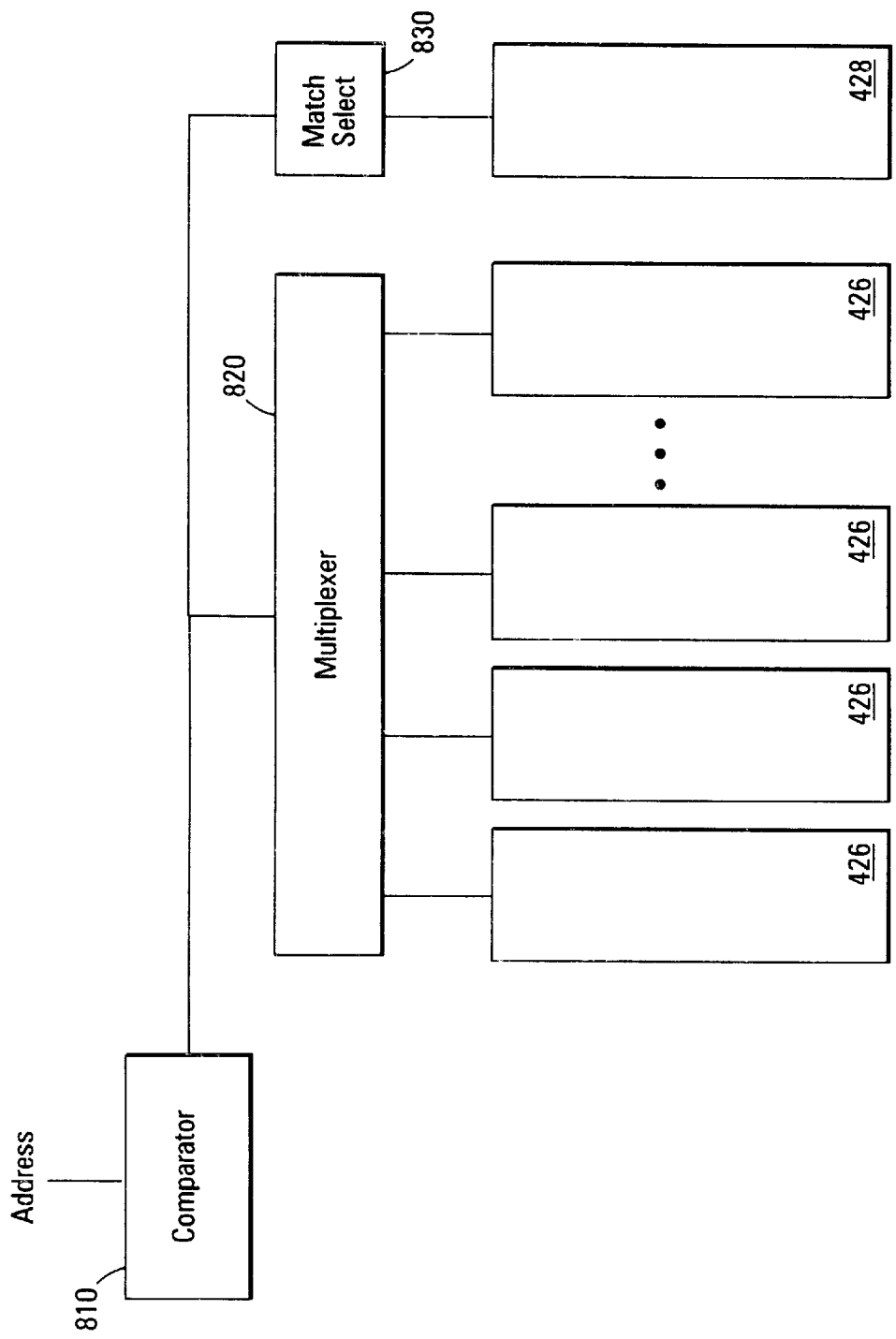
FIG. 8 is a block diagram of a portion of a memory device in accordance with 25 an embodiment of the invention.

FIG. 8 is a block diagram of a portion of a memory device in accordance with an embodiment of the invention. An address applied to the memory device is received by a comparator 810. The comparator 810, which may be part of the addressing circuitry of the memory device, is coupled to at least one primary grouping of memory cells 426 and at least one redundant grouping of memory cells 428 through a multiplexer 820 and a match select circuit 830, respectively. If the address applied to the memory device does not correspond to a known defective primary grouping of memory cells 426, it will be directed to the target memory cell through multiplexer 820. If the address does correspond to a known defective primary grouping of memory cells 426, multiplexer 820 is disabled, such that the known defective primary grouping of memory cells is not accessed, and match select circuit 830 is activated, such that the redundant grouping of memory cells 428 is instead accessed.

The terms memory cell, memory block, memory sector, and memory bank have been used to describe increasingly higher-level views of a memory array. However, the invention includes memory array structures as described herein relative to these terms, and should not be limited to any preconceived notion of what these terms may convey.

CONCLUSION

Various embodiments of the invention have been shown to have architectures suited for high-performance memory devices, with particular reference to synchronous non-volatile memory devices. Memory devices in accordance with the various embodiments of the invention include blocks of memory cells arranged in columns with each column of memory cells coupled to a local bit line. Such memory devices further include global bit lines having multiple local bit lines selectively coupled to each global bit line, with each global bit line extending to local bit lines in each memory block of a memory sector. Global bit lines are coupled to sensing devices generally in pairs. Repair of one or more defective columns of memory cells within a sector is effected by providing a redundant grouping of memory cells having a redundant sense amplifier, global bit lines and local bit lines. Access requests directed to memory cells within a primary grouping of memory cells containing a defective column are redirected to one such redundant grouping of memory cells.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory array, comprising:
    at least one memory block having columns of memory cells, each column memory cells being coupled to a local bit line;
    at least one primary grouping of memory cells, comprising a primary sensing device coupled to a first primary global bit line and a second primary global bit line, wherein each primary global bit line is coupled to at least two local bit lines of each memory block;
    at least one redundant grouping of memory cells, comprising a redundant sensing device coupled to a first redundant global bit line and a second redundant global bit line, wherein each redundant global bit line is coupled to at least two local bit lines of each memory block; and
    a comparator coupled to the at least one primary grouping of memory cells and the at least one redundant grouping of memory cells for selectively accessing one of the redundant groupings of memory cells when an address applied to the memory array corresponds to a memory cell in a known defective primary grouping of memory cells.

2. The memory array of claim 1, wherein the address applied to the memory array is directed to a memory cell in a non-defective column of memory cells.

3. A memory array, comprising:
    at least one memory block having columns of memory cells, each column of memory cells being coupled to a local bit line;
    at least one primary grouping of memory cells, comprising a primary sensing device coupled to a first primary global bit line and a second primary global bit line, wherein each primary global bit line is coupled to at least two local bit lines of each memory block;
    at least one redundant grouping of memory cells, comprising a redundant sensing device coupled to a first redundant global bit line and a second redundant global bit line, wherein each redundant global bit line is coupled to at least two local bit lines of each memory block; and
    wherein access requests to a memory cell in a known defective primary grouping of memory cells are routable to a redundant grouping of memory cells to access a memory cell in that redundant grouping of memory cells.

4. The memory array of claim 3, wherein the access request is directed to a memory cell in a non-defective column of memory cells.

5. A memory array, comprising:
    at least one memory block having columns of memory cells, each column of memory cells being coupled to a local bit line;
    at least one primary grouping of memory cells, comprising a primary sensing device coupled to a first primary global bit line and a second primary global bit line, wherein each primary global bit line is coupled to at least two local bit lines of each memory block;
    at least one redundant grouping of memory cells, comprising a redundant sensing device coupled to a first redundant global bit line and a second redundant global bit line, wherein each redundant global bit line is coupled to at least two local bit lines of each memory block; and
    addressing circuitry coupled to the at least one primary grouping of memory cells and the at least one redundant grouping of memory cells for decoding an address applied to the memory array, for determining whether the address is directed to a memory cell in a known defective primary grouping of memory cells, and for addressing a redundant grouping of memory cells when the address is directed to a memory cell in a known defective primary grouping of memory cells.

6. The memory array of claim 5, wherein the address applied to the memory array is directed to a memory cell in a non-defective column of memory cells.

7. A memory array, comprising:
- a first memory block having columns of memory cells coupled to a plurality of first local bit lines;
- a second memory block having columns of memory cells coupled to a plurality of second local bit lines;
- at least one primary grouping of memory cells, comprising a primary sensing device coupled to a first primary global bit line and a second primary global bit line, wherein each primary global bit line is coupled to at least two primary local bit lines from the plurality of first local bit lines and at least two primary local bit lines from the plurality of second local bit lines through selective coupling devices;
- at least one redundant grouping of memory cells, comprising a redundant sensing device coupled to a first redundant global bit line and a second redundant global bit line, wherein each redundant global bit line is coupled to at least two redundant local bit lines from the plurality of first local bit lines and at least two redundant local bit lines from the plurality of second local bit lines through selective coupling devices; and
- a comparator coupled to the primary groupings of memory cells and the redundant groupings of memory cells for selectively accessing one of the redundant groupings of memory cells when an address applied to the memory array corresponds to a memory cell in a known defective primary grouping of memory cells.

8. The memory array of claim 7, further comprising at least one additional memory block having columns of memory cells coupled to a plurality of additional local bit lines, wherein each global bit line is coupled to at least two of the additional local bit lines through selective coupling devices.

9. The memory array of claim 7, wherein the address applied to the memory array is directed to a memory cell in a non-defective column of memory cells.

10. A memory array, comprising:
- a first memory block having columns of memory cells coupled to a plurality of first local bit lines;
- a second memory block having columns of memory cells coupled to a plurality of second local bit lines;
- at least one primary grouping of memory cells, comprising a primary sensing device coupled to a first primary global bit line and a second primary global bit line, wherein each primary global bit line is coupled to at least two primary local bit lines from the plurality of first local bit lines and at least two primary local bit lines from the plurality of second local bit lines through selective coupling devices; and
- at least one redundant grouping of memory cells, comprising a redundant sensing device coupled to a first redundant global bit line and a second redundant global bit line, wherein each redundant global bit line is coupled to at least two redundant local bit lines from the plurality of first local bit lines and at least two redundant local bit lines from the plurality of second local bit lines through selective coupling devices;
- wherein an access request to a memory cell in a known defective primary grouping of memory cells is routable to one of the redundant groupings of memory cells to access a memory cell in that redundant grouping of memory cells.

11. The memory array of claim 10, further comprising at least one additional memory block having columns of memory cells coupled to a plurality of additional local bit lines, wherein each global bit line is coupled to at least two of the additional local bit lines through selective coupling devices.

12. The memory array of claim 10, wherein the access request is directed to a memory cell in a non-defective column of memory cells.

13. A memory array, comprising:
- a first memory block having columns of memory cells coupled to a plurality of first local bit lines;
- a second memory block having columns of memory cells coupled to a plurality of second local bit lines;
- at least one primary grouping of memory cells, comprising a primary sensing device coupled to a first primary global bit line and a second primary global bit line, wherein each primary global bit line is coupled to at least two primary local bit lines from the plurality of first local bit lines and at least two primary local bit lines from the plurality of second local bit lines through selective coupling devices;
- at least one redundant grouping of memory cells, comprising a redundant sensing device coupled to a first redundant global bit line and a second redundant global bit line, wherein each redundant global bit line is coupled to at least two redundant local bit lines from the plurality of first local bit lines and at least two redundant local bit lines from the plurality of second local bit lines through selective coupling devices; and
- addressing circuitry coupled to the primary groupings of memory cells and the redundant groupings of memory cells for decoding an address applied to the memory array, for determining whether the address is directed to a memory cell in a known defective primary grouping of memory cells, and for addressing one of the redundant groupings of memory cells when the address is directed to a memory cell in a known defective primary grouping of memory cells.

14. The memory array of claim 13, further comprising at least one additional memory block having columns of memory cells coupled to a plurality of additional local bit lines, wherein each global bit line is coupled to at least two of the additional local bit lines through selective coupling devices.

15. The memory array of claim 13, wherein the address applied to the memory array is directed to a memory cell in a non-defective column of memory cells.

16. A memory array, comprising:
- at least two memory blocks, each memory block having columns of non-volatile memory cells coupled to a plurality of local bit lines;
- a plurality of primary global bit lines, wherein each primary global bit line extends to each of the at least two memory blocks;
- a plurality of redundant global bit lines, wherein each redundant global bit line extends to each of the at least two memory blocks;
- a plurality of block pass transistors coupled between each plurality of local bit lines and each plurality of global bit lines to selectively couple each local bit line to a global bit line, wherein each local bit line is coupled to only one global bit line through a block pass transistor and each global bit line is coupled to more than one local bit line, each through a block pass transistor;
- a plurality of primary sense amplifiers coupled to the plurality of primary global bit lines, wherein two primary global bit lines are coupled to each primary sense amplifier;

at least one redundant sense amplifier coupled to the plurality of redundant global bit lines, wherein two redundant global bit lines are coupled to each redundant sense amplifier; and wherein access requests to a memory cell associated with a primary sense amplifier associated with a known defective column of memory cells are routable to a memory cell associated with a redundant sense amplifier.

17. A memory array, comprising:

at least two memory blocks, each memory block having columns of non-volatile memory cells coupled to a plurality of local bit lines;

a plurality of primary global bit lines, wherein each primary global bit line extends to each of the at least two memory blocks;

a plurality of redundant global bit lines, wherein each redundant global bit line extends to each of the at least two memory blocks;

a plurality of block pass transistors coupled between each plurality of local bit lines and each plurality of global bit lines to selectively couple each local bit line to a global bit line, wherein each local bit line is coupled to only one global bit line through a block pass transistor and each global bit line is coupled to more than one local bit line, each through a block pass transistor;

a plurality of primary sense amplifiers coupled to the plurality of primary global bit lines, wherein two primary global bit lines are coupled to each primary sense amplifier;

at least one redundant sense amplifier coupled to the plurality of redundant global bit lines, wherein two redundant global bit lines are coupled to each redundant sense amplifier; and addressing circuitry coupled to the at least two memory blocks for decoding an address applied to the memory array, for determining whether the address is directed to a memory cell associated with a primary sense amplifier associated with a known defective column of memory cells, and for addressing a memory cell associated with a redundant sense amplifier when the address is directed to a memory cell associated with a primary sense amplifier associated with a known defective column of memory cells.

18. A memory device, comprising:

a row decoder circuit;

a column decoder circuit; and a memory array coupled to the row decoder circuit and the column decoder circuit, the memory array comprising:

a first memory block having columns of memory cells coupled to a plurality of first local bit lines;

a second memory block having columns of memory cells coupled to a plurality of second local bit lines;

at least one primary grouping of memory cells, comprising a primary sensing device coupled to a first primary global bit line and a second primary global bit line, wherein each primary global bit line is coupled to at least two primary local bit lines from the plurality of first local bit lines and at least two primary local bit lines from the plurality of second local bit lines through selective coupling devices; and at least one redundant grouping of memory cells, comprising a redundant. sensing device coupled to a first redundant global bit line and a second redundant global bit line, wherein each redundant global bit line is coupled to at least two redundant local bit lines from the plurality of first local bit lines and at least two redundant local bit lines from the plurality of second local bit lines through selective coupling devices.

19. The memory device of claim 18, further comprising a comparator coupled to the primary groupings of memory cells and the redundant groupings of memory cells for selectively accessing one of the redundant groupings of memory cells when an address applied to the memory array corresponds to a memory cell in a known defective primary grouping of memory cells.

20. The memory device of claim 18, further comprising addressing circuitry coupled to the primary groupings of memory cells and the redundant groupings of memory cells for decoding an address applied to the memory array, for determining whether the address is directed to a memory cell in a known defective primary grouping of memory cells, and for addressing one of the redundant groupings of memory cells when the address is directed to a memory cell in a known defective primary grouping of memory cells.

21. The memory device of claim 18, wherein an access request to a memory cell in a known defective primary grouping of memory cells is routable to one of the redundant groupings of memory cells to access a memory cell in that redundant grouping of memory cells.

22. A memory device, comprising:

a row decoder circuit;

a column decoder circuit; and a memory array coupled to the row decoder circuit and the column decoder circuit, the memory array comprising:

at least one memory block having columns of memory cells, each column of memory cells being coupled-to a local bit line;

at least one primary grouping of memory cells, comprising a primary sensing device coupled to a first primary global bit line and a second primary global bit line, wherein each primary global bit line is coupled to at least two local bit lines of each memory block; and at least one redundant grouping of memory cells, comprising a redundant sensing device coupled to a first redundant global bit line and a second redundant global bit line, wherein each redundant global bit line is coupled to at least two local bit lines of each memory block.

23. The memory device of claim 22, further comprising a comparator coupled to the at least one primary grouping of memory cells and the at least one redundant grouping of memory cells for selectively accessing one of the redundant groupings of memory cells when an address applied to the memory array corresponds to a memory cell in a known defective primary grouping of memory cells.

24. The memory device of claim 22, further comprising addressing circuitry coupled to the at least one primary grouping of memory cells and the at least one redundant grouping of memory cells for decoding an address applied to the memory array, for determining whether the address is directed to a memory cell in a known defective primary grouping of memory cells, and for addressing a redundant grouping of memory cells when the address is directed to a memory cell in a known defective primary grouping of memory cells.

25. The memory device of claim 22, wherein access requests to a memory cell in a known defective primary grouping of memory cells are routable to a redundant grouping of memory cells to access a memory cell in that redundant grouping of memory cells.

26. A synchronous flash memory device, comprising:
a memory array having non-volatile flash memory cells; and
a command execution logic coupled to the memory array for receiving at least a system clock input signal and for generating commands to control operations performed on the memory array, wherein the commands are synchronized to the system clock input signal;
wherein the memory array further comprises:
   a first memory block having columns of the non-volatile flash memory cells coupled to a plurality of first local bit lines;
   a second memory block having columns of the non-volatile flash memory cells coupled to a plurality of second local bit lines;
   at least one primary grouping of memory cells, comprising a primary sensing device coupled to a first primary global bit line and a second primary global bit line, wherein each primary global bit line is coupled to at least two primary local bit lines from the plurality of first local bit lines and at least two primary local bit lines from the plurality of second local bit lines through selective coupling devices; and
   at least one redundant grouping of memory cells, comprising a redundant sensing device coupled to a first redundant global bit line and a second redundant global bit line, wherein each redundant global bit line is coupled to at least two redundant local bit lines from the plurality of first local bit lines and at least two redundant local bit lines from the plurality of second local bit lines through selective coupling devices.

27. The synchronous flash memory device of claim 26, further comprising a comparator coupled to the primary groupings of memory cells and the redundant groupings of memory cells for selectively accessing one of the redundant groupings of memory cells when an address applied to the memory array corresponds to a non-volatile flash memory cell in a known defective primary grouping of memory cells.

28. The synchronous flash memory device of claim 26, further comprising addressing circuitry coupled to the primary groupings of memory cells and the redundant groupings of memory cells for decoding an address applied to the memory array, for determining whether the address is directed to a non-volatile flash memory cell in a known defective primary grouping of memory cells, and for addressing one of the redundant groupings of memory cells when the address is directed to a non-volatile flash memory cell in a known defective primary grouping of memory cells.

29. The synchronous flash memory device of claim 26, wherein an access request to, a non-volatile flash memory cell in a known defective primary grouping of memory cells is routable to one of the redundant groupings of memory cells to access a non-volatile flash memory cell in that redundant grouping of memory cells.

30. A synchronous flash memory device, comprising:
a memory array having non-volatile flash memory cells; and
a command execution logic coupled to the memory array for receiving at least a system clock input signal and for generating commands to control operations performed on the memory array, wherein the commands are synchronized to the system clock input signal;
wherein the memory array further comprises:
   at least one memory block having columns of the non-volatile flash memory cells, each column of the non-volatile flash memory cells being coupled to a local bit line;
   at least one primary grouping of memory cells, comprising a primary sensing device, coupled to a first primary global bit line and a second primary global bit line, wherein each primary global bit line is coupled to at least two local bit lines of each memory block; and
   at least one redundant grouping of memory cells, comprising a redundant sensing device coupled to a first redundant global bit line and a second redundant global bit line, wherein each redundant global bit line is coupled to at least two local bit lines of each memory block.

31. The synchronous flash memory device of claim 30, further comprising a comparator coupled to the at least one primary grouping of memory cells and the at least one redundant grouping of memory cells for selectively accessing one of the redundant groupings of memory cells when an address applied to the memory array corresponds to a non-volatile flash memory cell in a known defective primary grouping of memory cells.

32. The synchronous flash memory device of claim 30, further comprising addressing circuitry coupled to the at least one primary grouping of memory cells and the at least one redundant grouping of memory cells for decoding an address applied to the memory array, for determining whether the address is directed to a non-volatile flash memory cell in a known defective primary grouping of memory cells, and for addressing a redundant grouping of memory cells when the address is directed to a non-volatile flash memory cell in a known defective primary grouping of memory cells.

33. The synchronous flash memory device of claim 30, wherein access requests to a non-volatile flash memory cell in a known defective primary grouping of memory cells are routable to a redundant grouping of memory cells to access a non-volatile flash memory cell in that redundant grouping of memory cells.

34. A synchronous flash memory assembly, comprising:
a memory package having a plurality of interconnects; and
a synchronous flash memory device contained in the memory package, wherein the synchronous flash memory device comprises:
   a memory array, comprising:
      at least one memory block having columns of non-volatile flash memory cells, each column of non-volatile flash memory cells being coupled to a local bit line;
      at least one primary grouping of memory cells, comprising a primary sensing device coupled to a first primary global bit line and a second primary global bit line, wherein each primary global bit line is coupled to at least two local bit lines of each memory block; and
      at least one redundant grouping of memory cells, comprising a redundant sensing device coupled to a first redundant global bit line and a second redundant global bit line, wherein each redundant global bit line is coupled to at least two local bit lines of each memory block;
   address inputs coupled between the memory array and a first portion of the plurality of interconnects of the memory package;
   data inputs/outputs coupled between the memory array and a second portion of the plurality of interconnects of the memory package;

power inputs coupled between the memory array and a third portion of the plurality of interconnects of the memory package;

clock and control signal inputs coupled between the memory array and a fourth portion of the plurality of interconnects of the memory package; and a command execution logic coupled to the memory array for receiving at least a system clock input signal from the clock and control signal inputs and for generating commands to control operations performed on the memory array synchronized to the system clock input signal.

35. The synchronous flash memory assembly of claim 34, wherein the plurality of interconnects comprises a plurality of interconnect pins having a pin layout substantially similar to an industry standard SDRAM TSOP pin layout.

36. The synchronous flash memory assembly of claim 34, wherein the plurality of interconnects comprises a plurality of bump connections having a bump layout substantially similar to an industry standard SDRAM FBGA bump layout.

37. The synchronous flash memory assembly of claim 34, wherein the memory array further comprises a comparator coupled to the at least one primary grouping of memory cells and the at least one redundant grouping of memory cells for selectively accessing one of the redundant groupings of memory cells when an address applied to the memory array corresponds to a non-volatile flash memory cell in a known defective primary grouping of memory cells.

38. The synchronous flash memory assembly of claim 34, wherein the memory array further comprises addressing circuitry coupled to the at least one primary grouping of memory cells and the at least one redundant grouping of memory cells for decoding an address applied to the memory array, for determining whether the address is directed to a non-volatile flash memory cell in a known defective primary grouping of memory cells, and for addressing a redundant grouping of memory cells when the address is directed to a non-volatile flash memory cell in a known defective primary grouping of memory cells.

39. The synchronous flash memory assembly of claim 34, wherein access requests to a non-volatile flash memory cell of the memory array are routable to a redundant grouping of memory cells when the requested non-volatile flash memory cell is in a known defective primary grouping of memory cells.

40. A memory assembly, comprising:

a memory package having a plurality of interconnects; and a memory device contained in the memory package, wherein the memory device comprises:

a memory array having at least one memory bank, each memory bank having at least one memory sector, and each memory sector having at least one memory block, wherein each memory block has columns of addressable memory cells, each column of memory cells being coupled to a local bit line;

at least one primary grouping of memory cells in a first memory sector, the at least one primary grouping of memory cells comprising a primary sensing device coupled to a first primary global bit line and a second primary global bit line, wherein each primary global bit line is coupled to at least two local bit lines of each memory block of the first memory sector;

at least one redundant grouping of memory cells in the first memory sector, the at least one redundant grouping of memory cells comprising a redundant sensing device coupled to a first redundant global bit line and a second redundant global bit line, wherein each redundant global bit line is coupled to at least two local bit lines of each memory block of the first memory sector;

a comparator coupled to the at least one primary grouping of memory cells and the at least one redundant grouping of memory cells for selectively accessing one of the redundant groupings of memory cells when an address applied to the memory array corresponds to a memory cell in a known defective primary grouping of memory cells in the first memory sector;

address inputs coupled between the memory array and a first portion of the plurality of interconnects of the memory package; and data inputs/outputs coupled between the memory array and a second portion of the plurality of interconnects of the memory package.

\* \* \* \* \*

UNITED STATES PATENT AND TRADEMARK OFFICE
CERTIFICATE OF CORRECTION

PATENT NO.    : 6,496,425 B1                                              Page 1 of 1
DATED         : December 17, 2002
INVENTOR(S)   : Ebrahim Abedifard It is certified that error appears in the above-identified patent and that said Letters Patent is hereby corrected as shown below:

Column 5,
Line 26, replace "stored in the memo can be accessed" with -- stored in the memory can be accessed --

Column 9,
Lines 15-16, replace "a while increasing the ratio" with -- While increasing the ratio --

Column 11,
Line 64, replace "cells, each column memory cells" with -- cells, each column of memory cells --

Column 16,
Line 32, replace "memory cells being coupled-to" with -- memory cells being coupled to --

Column 17,
Line 52, replace "access request to, a non-volatile" with -- access request to a non-volatile --

Column 18,
Line 1, replace "on-volatile flash" with -- non-volatile flash --
Line 4, replace "primary sensing device, coupled" with -- primary sensing device coupled --

Signed and Sealed this

Eighth Day of July, 2003

JAMES E. ROGAN
*Director of the United States Patent and Trademark Office*